(12) United States Patent
Kosinski

(10) Patent No.: US 7,298,067 B1
(45) Date of Patent: Nov. 20, 2007

(54) DAMPED PACKAGE FOR PIEZOELECTRIC DEVICES

(75) Inventor: John A. Kosinski, Neptune, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 11/543,279

(22) Filed: Sep. 25, 2006

(51) Int. Cl.
*H01L 41/053* (2006.01)

(52) U.S. Cl. .................. 310/341; 310/313 R; 310/320; 310/324; 310/348

(58) Field of Classification Search ............ 310/313 R, 310/320, 324, 341, 348
See application file for complete search history.

(56) References Cited

U.S. PATENT DOCUMENTS 4,021,898 A * 5/1977 Willis et al. ............... 29/25.35
4,333,342 A * 6/1982 Gilden et al. ............ 73/514.12
4,676,104 A * 6/1987 Cullen ...................... 73/514.12

FOREIGN PATENT DOCUMENTS

DE 102005032319 * 1/2007

* cited by examiner

*Primary Examiner*—Thomas M. Dougherty
(74) *Attorney, Agent, or Firm*—Michael Zelenka; George B. Tereschuk

(57) ABSTRACT

A packaging system for piezoelectric devices is provided that substantially reduces and avoids the deleterious effects of environmental vibrations and shocks with gas or fluid-filled chambers that drastically improve the resonator's ability to withstand unwanted disturbances and decrease or eliminate the attendant frequency shifts. The damped piezoelectric resonator packaging system combines a resonator package, a membrane and gas/fluid-filled chambers that dampen dynamic amplification of the resonator and firmly restrain the resonator within the packaging system. The selection of gas or fluid for the chamber depends upon variables such as the type of waves being propagated and interaction with the piezoelectric substrate.

19 Claims, 4 Drawing Sheets

DAMPED PACKAGE FOR PIEZOELECTRIC DEVICES

GOVERNMENT INTEREST

The invention described herein may be manufactured, used and licensed by or for the Government of the United States of America without the payment by the Government of any royalties thereon.

FIELD OF THE INVENTION

The invention relates generally to piezoelectric devices and, in particular, to gas-damped packages for piezoelectric devices.

BACKGROUND OF THE INVENTION

Piezoelectric resonators are well known in the art. Piezoelectric resonators are electronic elements used to make a frequency stable and selectable. Piezoelectric resonators are widely used in various kinds of electronic equipment including communication systems, intelligence sensors, precision guided munitions, cordless telephones, broadcast and television, satellite telecommunication, electronic clocks, digital instruments and so on. Piezoelectric resonators can also be used as sensors of temperature, pressure and weight. The properties of the crystal resonator depend on the angles of cut. Metal electrodes are disposed upon the crystal wafer, which is mounted in a structure designed to hold the crystal wafer. This crystal and holder assembly is called a piezoelectric resonator. Piezoelectric crystal devices are used primarily for precise frequency control and timing. Quartz is the most widely used piezoelectric material. Quartz resonators are manufactured by cutting wafers from the mother crystal along precisely controlled directions with respect to the crystallographic axes. A quartz crystal acts as a stable mechanical resonator, which, by its piezoelectric behavior and high Q, determines the frequency generated in an oscillator circuit. Bulk-wave resonators are available in the frequency range from about 1 kHz to 200 MHz. Surface-acoustic wave (SAW), shallow-bulk-acoustic-wave (SBAW), and surface transverse wave (STW) devices can be made to operate at well above 1 GHz.

The frequency of a piezoelectric resonator is adversely affected by environmental stresses that deform the resonator, including vibration and shock, gravitational stress, temperature, aging, thermal hysteresis and so on. Even the acceleration due to gravity produces measurable effects and the frequency of a piezoelectric resonator can shift significantly when turned upside down due to gravity. For example, when an oscillator using an AT-cut crystal is turned upside down, the frequency typically shifts about $4 \times 10^{-9}$ and acceleration sensitivity of an AT-cut crystal is typically $2 \times 10^{-9}$ $g^{-1}$. The sensitivity is the same when the crystal is subjected to vibration, i.e., the time-varying acceleration due to the vibration modulates the frequency at the vibration frequency with amplitude of $2 \times 10^{-9}$ $g^{-1}$. In the frequency domain, the vibration sensitivity manifests itself as vibration-induced sidebands that appear at plus and minus the vibration frequency away from the carrier frequency. The acceleration sensitivity of SC-cut crystals can be made to be substantially less than that of comparably fabricated AT- or BT-Cut crystals.

The stresses caused by acceleration, vibration and shock are well-known to those skilled in the art. Periodic acceleration in the form of vibration can cause frequency modulation in piezoelectric resonators, and shock can cause a step frequency change in a piezoelectric resonator due to the resonator's acceleration sensitivity. Shock can also cause a permanent frequency change in a piezoelectric resonator if either the supporting structure or the electrodes are stressed beyond their elastic limits. If during shock the elastic limits in the crystal's support structure or in its electrodes are exceeded, the shock can produce a permanent frequency change. Crystal units made with chemically polished plates can withstand shocks in excess of 20,000 g. Such crystals have been successfully fired from howitzers; however this ability to withstand shock is not typical. Therefore the stresses caused by acceleration, vibration and shock and the consequent negative and deleterious effects on piezoelectric frequency stability have caused prior art piezoelectric resonators to suffer from numerous disadvantages, limitations and shortcomings.

Similar difficulties are encountered in undamped mechanical mounting systems where the dynamic amplification at the mechanical resonance frequency of the support structure causes unwanted and undesirable frequency shifts in the piezoelectric resonator. Prior art approaches to the problem of undamped mechanical mounting systems have typically involved large packages allowing for large travel of the support structure and a degradation of specifications near the mechanical resonance frequency. However, these techniques have proven unsatisfactory due to a number of disadvantages, limitations and shortcomings such as excessive size and weight, and the need for improved performance at low mechanical vibration frequencies. Thus, there has been a long-felt need to overcome the problems caused by the dynamic amplification of an unrestrained, or undamped, piezoelectric resonator at the mechanical resonance frequency. Until now, there are no currently available piezoelectric packaging techniques that satisfactorily damp mechanical and structural resonances of a mounted piezoelectric device.

SUMMARY OF THE INVENTION

In order to satisfy the long-felt needs for practical piezoelectric packaging techniques that advantageously damp, or restrain, mechanical and structural resonances, the inventor has focused on environmental vibrations in the frequencies up to 2 KHz. This range was selected because most system specifications require the consideration of environmental vibrations at frequencies up to 2 KHz, but not above 2 KHz. Using a conventional package, the packaged piezoelectric device cannot be designed with any mechanical and structural resonances at or below 2 KHz. In order to assure that the mechanical and structural resonance frequencies are above 2 KHz, prior art devices found it necessary to use stiff mounting supports. The problem with stiff mounting supports is that they lead to substantial built-in stresses during the fabrication process as a result of either misalignment during fabrication or slight differences in thermal expansion combined with the difference between the fabrication temperature and the operating temperature of the device. With the passage of time, the built-in stresses are relieved and this stress relief causes the operating frequency of the piezoelectric device to shift. Such shifts are highly undesirable and are commonly referred to as "aging" of the piezoelectric device. Such built-in stresses could be minimized with the use of softer mounting supports. Softer mounting supports tend to minimize built-in stresses and eliminate undesirable frequency shifts because the forces generated by the softer mounting supports are less than those generated by stiffer supports.

In order to answer the long-felt need for softer and thus more practical piezoelectric packaging techniques for overcoming environmental vibrations, while still avoiding the numerous disadvantages, limitations and shortcomings caused by stiff packaging arrangements, the inventor herein has developed a piezoelectric packaging system to damp the mechanical and structural resonances of a mounted piezoelectric device, without suffering from the disadvantages, shortcomings and limitations of prior art devices.

The present invention is a packaging system for piezoelectric devices that substantially reduces and avoids the deleterious effects of environmental vibrations and shocks with gas or fluid-filled chambers that drastically improve the resonator's ability to withstand unwanted disturbances and decrease or eliminate the attendant frequency shifts. The gas or fluid-filled chambers of this invention's piezoelectric packaging system resolve the problems and difficulties that are inherent in prior art undamped mechanical systems, such as dynamic amplification at the mechanical resonance frequency of the mounted device, without suffering from the disadvantages, shortcomings and limitations of prior art devices. The selection of gas or fluid for the chamber depends upon variables such as the type of waves being propagated and interaction with the piezoelectric substrate.

It is an object of the present invention to provide a packaging system for piezoelectric devices that reduces frequency shifting from environmental shocks and vibration.

It is another object of the present invention to provide a damped mounting system for piezoelectric devices that eliminates frequency shifting from environmental shocks and vibration.

It is a further object of the present invention to provide a damped mounting system for piezoelectric devices with a fluid-filled chamber that eliminates frequency shifting from environmental shocks and vibration, without suffering from the disadvantages, shortcomings and limitations of prior art stiff package devices.

These and other objects and advantages are provided by damped piezoelectric resonator packaging system of the present invention comprising a resonator package, a membrane and gas/fluid-filled chambers that dampen dynamic amplification of the resonator and firmly restrain the resonator within the packaging system in order to minimize or completely avoid the deleterious effects of unwanted environmental vibrations and shocks, without suffering from the disadvantages, shortcomings and limitations of prior art stiff package devices.

DETAILED DESCRIPTION OF THE DRAWINGS

The various embodiments of the damped piezoelectric resonator packaging devices, structures and systems of the present invention comprise a container, a resonator, a membrane and gas or fluid-filled chambers that cooperate to damp unwanted dynamic amplification of the resonator in the chambers after acceleration. The chambers advantageously curtail or reduce dynamic amplification by the gas or fluid to firmly restrain the piezoelectric resonator within the container and either minimize or completely avoid any deleterious frequency shifts caused by environmental vibrations and shocks. The use of a gas-damped packaging system in accordance with the present invention allows for the damping of mechanical and structural resonances of the packaged piezoelectric resonator. For the sake of convenience, the terms "gas-damped" or "fluid-damped" may be used interchangeably, but it must be understood that the designer's choice of gas or fluid for the chambers is dependent upon variables such as the type of waves being propagated and interaction with the piezoelectric substrate.

The amount of damping will determine the amount of dynamic amplification allowed at resonance, which, in turn, will permit the user to adjust the device and systems. Reducing dynamic amplification makes it possible to use a softer supporting structure, which can minimize aging and other effects of stress without suffering from the disadvantages, shortcomings and limitations of prior art restraint techniques.

By damping the dynamic amplification of the mechanical and structural resonance it is now possible to obtain acceptable device performance despite the occurrence of mechanical and structural resonances in the range of possible environmental vibration frequencies. In this example, that would mean mechanical and structural resonances at or below 2 KHz. Another advantage of damping in accordance with this invention is that it allows the design of packaging structures which act as mechanical low-pass filters. This type of structure has significant advantages when environmental vibrations are present at frequencies above 2 KHz. The packaging systems can be designed to provide mechanical isolation above the mechanical/structural resonance frequency while still providing acceptable device performance at or below the mechanical/structural resonance frequency.

Figure 1:
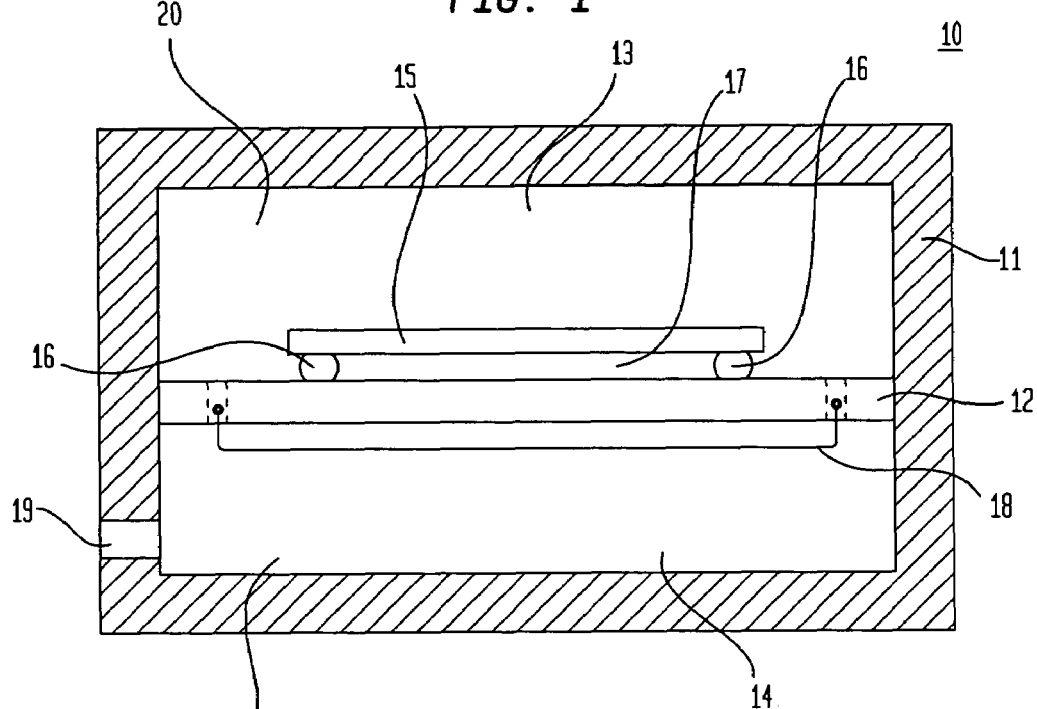
FIG. 1 shows a first embodiment of the gas damped resonator packaging device in accordance with the present invention.

Referring now to the drawings, FIG. 1 depicts a first embodiment of the gas damped resonator packaging device 10 of the present invention, comprising a container 11, a membrane 12, with the membrane 12 separating the container 11 into a first chamber 13 and a second chamber 14. The piezoelectric resonator 15 is fastened to membrane 12 by a means for fastening 16 in such a way that an evacuated region 17 may be formed underneath the resonator 15. Membrane 12 includes one or more orifices 18 that allow the damping gas to circulate between the first and second chambers 13 and 14. Container 11 further comprises a suitable valve means for inserting the damping gas, represented by box 19, such as a pinch-off valve, to introduce the damping gas 20 into container 11 and then seal the filled container 11. The gas or fluid damped resonator packaging device 10 may also be equipped with suitable electrodes on the piezoelectric device as well as such leads, interconnects, and feed-throughs as may be required by the user.

In operation, the interior of container 11 is evacuated and then backfilled to a desired pressure with a suitable damping gas 20, such as nitrogen. The container 11 is then sealed to maintain the desired damping gas pressure. The damping gas 20 provides a controlled resistance to the movement of the piezoelectric device 15. The evacuated region 17 allows for damping of the mechanically induced vibrations while preventing the gas from damping the desired piezoelectrically driven mode, which in this embodiment could be a Rayleigh wave or SAW mode. Container 11 may be constructed of any number of materials capable of maintaining the damping gas without leakage and without corrosion due to chemical interactions with the gas.

Figure 2:
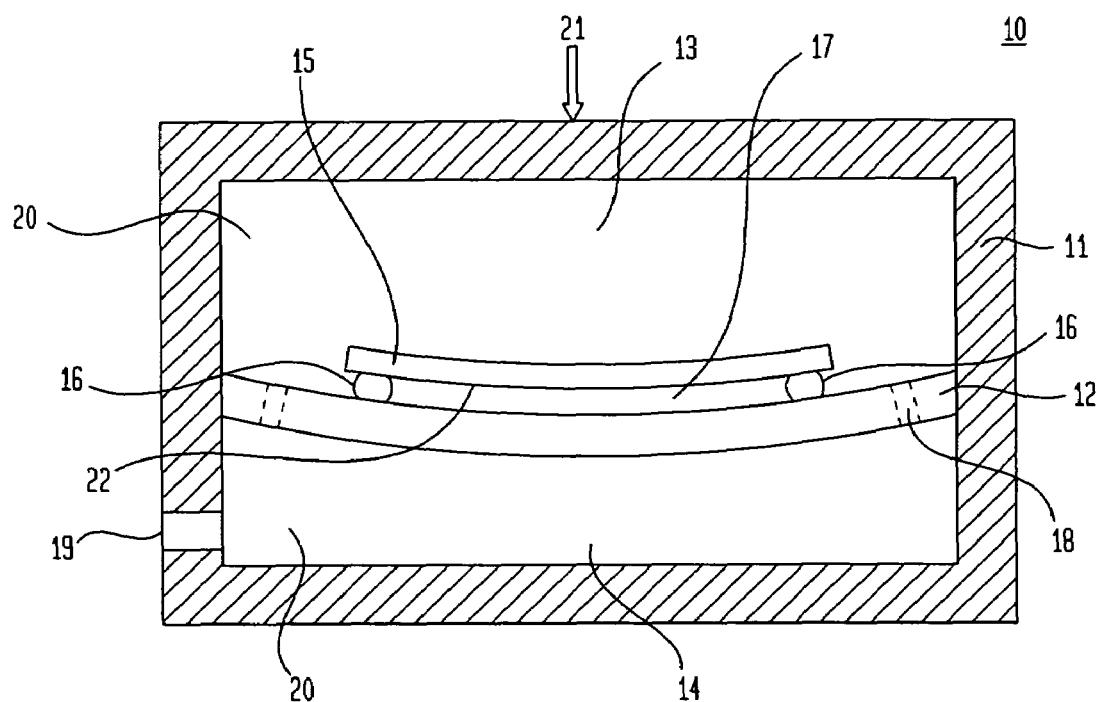
FIG. 2 illustrates the effects of acceleration on the first embodiment of this invention's gas damped resonator packaging device.

FIG. 2 depicts the gas damped packaging device 10 being subjected to a downward acceleration stress, represented by arrow 21. As a result of the acceleration stress 21, membrane 12 and piezoelectric device 15 bend downward and exert pressure against the second chamber 14, with the degree of the bend somewhat exaggerated for purposes of illustration. As membrane 12 tries to move, the volume of the first, or upper, chamber 13 increases while the volume of the second, or lower, chamber 14 decreases. As a result, the gas pressure in the upper chamber 13 is decreased while the gas pressure in the lower chamber 14 is increased, thereby generating increased resistance in the lower chamber 14 to the movement of the membrane 12 which stabilizes the piezoelectric resonator 15. The orifices 18 allow the damping gas 20 to flow from the high pressure lower chamber 14, to the low pressure upper chamber 13, in this example, at a controlled rate. The rate of flow of the damping gas 20 will determine, in part, the overall damping characteristics of the packaging device 10 in a fashion well known to those skilled in the art of mechanical damping systems.

Variations of the gas damped packaging device 10 include different configurations depending upon the type of piezoelectric device such as Surface Acoustic Waves (SAW), Surface Transverse Waves (STW) or Bulk Acoustic Waves (BAW). The FIG. 1 gas damped resonator packaging device 10 can be appropriate for an SAW device because the acoustic wave propagating in the piezoelectric resonator 15 device would be adversely affected by direct contact with the damping gas 20. Referring back to FIG. 2, if the piezoelectric resonator 15 propagates an SAW, the SAW would propagate on the lower surface 22 of piezoelectric resonator 15 that contacts the evacuated region 17. Other variations include the type of damping gas 20 pumped into the container 11, using a damping fluid instead of gas and the fastening means 16 being either a suitable adhesive or support structure.

Figure 3A:
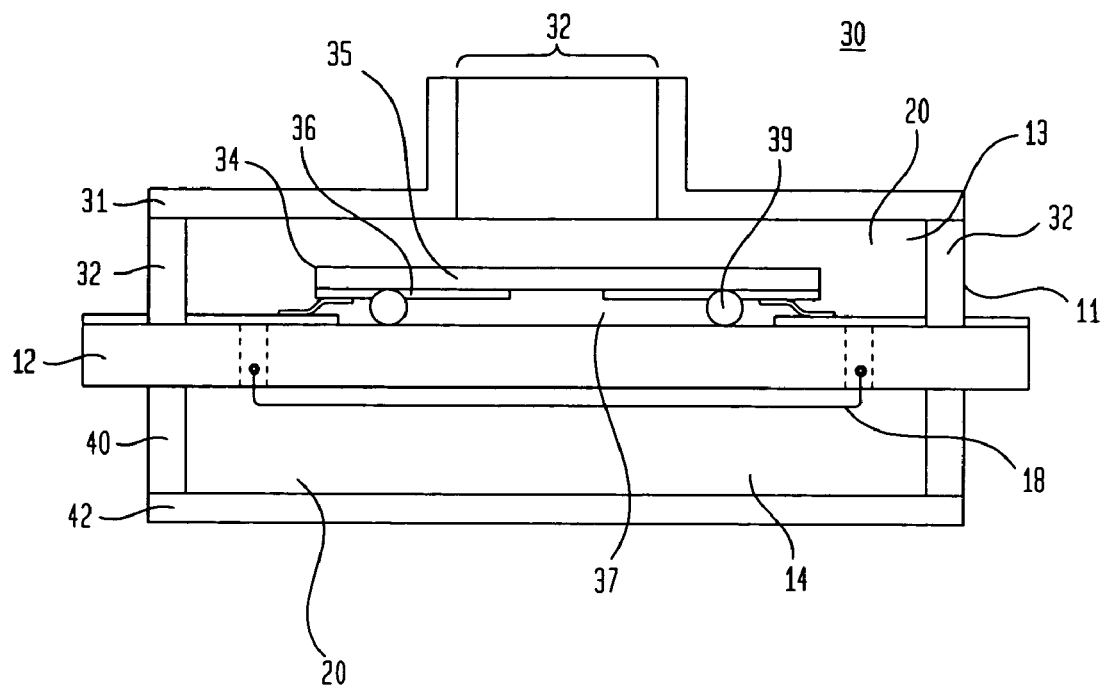
FIGS. 3A and 3B depict cut-away cross sectional and top views of the Surface Acoustic Waves (SAW) embodiment of this invention's gas damped resonator packaging system.
Figure 3B:
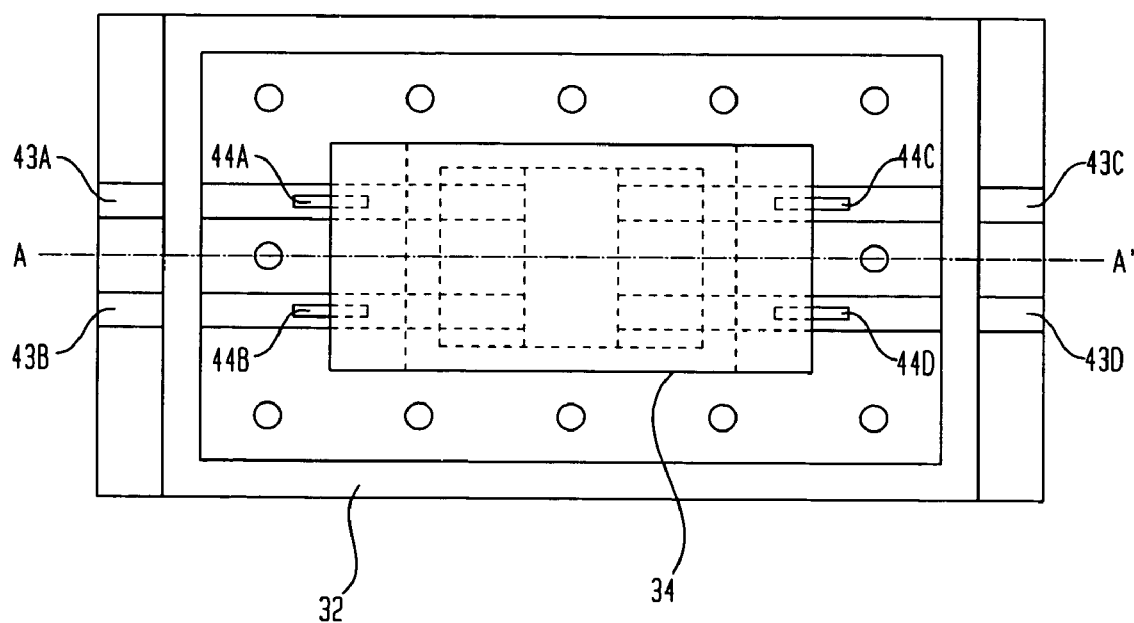

The present invention also contemplates a number of other embodiments of the gas damped resonator packaging arrangements for configurations that accommodate particular types of piezoelectric waves that are well-known to those skilled in the art. For example, FIGS. 3A and 3B illustrate a more detailed version of the FIG. 1 damped resonator packaging device in a Surface Acoustic Wave (SAW) configuration. In FIGS. 3A-5B the same numerals are employed for like structures. Referring now to FIG. 3A, there is depicted a cutaway cross-sectional view of the gas damped SAW resonator packaging system 30 of the present invention, comprising a container 11, a membrane 12 separating the container 11 into a first chamber 13 and a second chamber 14. The first chamber 13 further comprises a lid 31, upper sidewalls 32 and a valve means 33, such as a pinch-off valve, forming an integral part of the lid 31. The SAW piezoelectric resonator 34 further comprises a piezoelectric substrate 35 and an electrode metallization region 36 underneath the piezoelectric substrate 35. A gap 37 between the electrode metallization region 36 and membrane 12 defines an evacuated region 38. The SAW piezoelectric resonator 34 is fastened to membrane 12 with an adhesive support 39. Membrane 12 includes at least one orifice 18 that allows damping gas exchange between first chamber 13 and second chamber 14. The second chamber 14 further comprises a lower sidewall 40 and lower lid 41. Both chambers 13 and 14 are filled with a damping gas 20, or, in some cases, a viscous liquid may be substituted for damping gas 20.

In operation, after the container 11 is evacuated and filled with the proper fluid 20, when the container 11 is subjected to an environmental stress, the membrane 12 tries to move, the volume of the first, or upper, chamber 13 increases while the volume of the second, or lower, chamber 14 decreases. As a result, the gas pressure in the upper chamber 13 is decreased while the gas pressure in the lower chamber 14 is increased, thereby generating increased resistance in the lower chamber 14 to the movement of the membrane 12 which stabilizes the SAW piezoelectric resonator 34.

FIG. 3B illustrates a top view of gas damped SAW resonator packaging system 30, with the lid 31 removed, showing upper sidewall 32, feed through leads 43A-D and wire bonds 44A-D. Many of the variations that apply to the basic gas damped packaging device also apply to the gas damped SAW resonator packaging system 30, including the types of damping material pumped into the container 11 and the types of fastening means 16 employed.

Figure 4A:
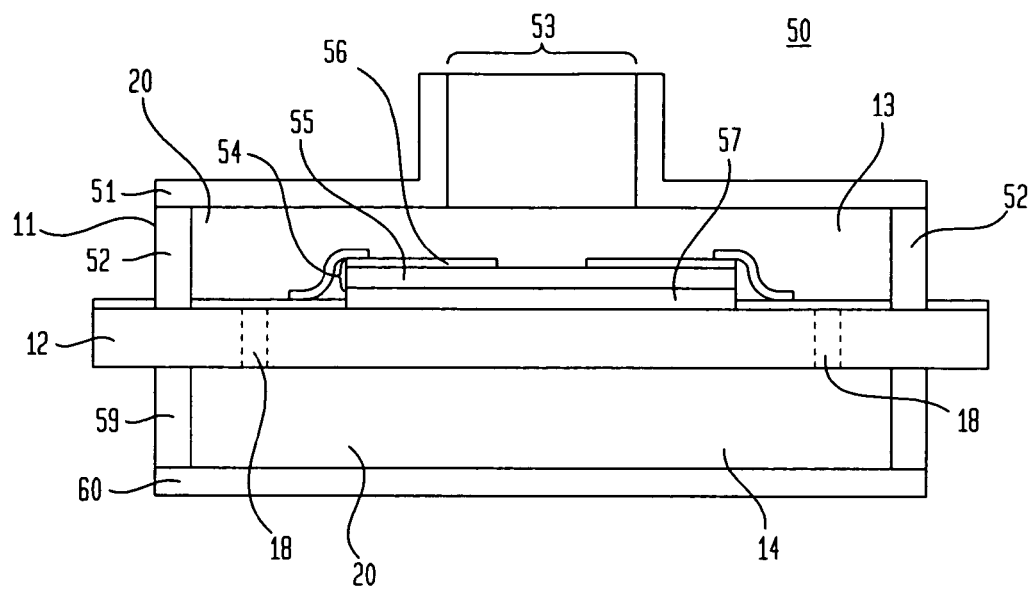
FIGS. 4A and 4B depict cut-away cross sectional and top views of the Surface Transverse Waves (STW) embodiment of this invention's gas damped resonator packaging system.

One preferred embodiment of the present invention is a gas damped Surface Transverse Wave (STW) resonator packaging apparatus 50 in which the piezoelectric resonator is not affected by its contact with the damping gas. This allows the piezoelectric resonator to be bonded directly to the membrane with the STW propagating on an upper surface of the piezoelectric device. Referring now to FIG. 4A, there is depicted a cutaway cross-sectional view of the gas damped STW resonator packaging apparatus 50, comprising a container 11, a membrane 12 separating the container 11 into an first chamber 13 and a second chamber 14. The first chamber 13 further comprises a lid 51, upper sidewalls 52 and a valve means 53, such as a pinch-off valve, forming an integral part of the lid 51. An STW piezoelectric resonator 54 further comprises a piezoelectric substrate 55 and an upper surface 56. The SAW piezoelectric resonator 54 is stacked on an adhesive layer 57 bonded to the membrane 12. A means for fastening 58 provides additional restraint for the STW piezoelectric resonator 54. In this configuration, the piezoelectric resonator 54 is bonded directly to membrane 12 by the adhesive layer 57, which affords additional stability against acceleration stresses. Membrane 12 includes at least one orifice 18 that allows damping gas exchange between the first, or upper, chamber 13 and second, or lower, chamber 14. The lower chamber 14 further comprises a lower sidewall 59 and lower lid 60. Both chambers 13 and 14 are filled with a damping gas 20. The cooperation of the membrane 12, the upper chamber 13, and lower chamber 14 results in increased resistance in the lower chamber 14 to the movement of the membrane 12 which stabilizes the STW piezoelectric resonator 54.

Figure 4B:
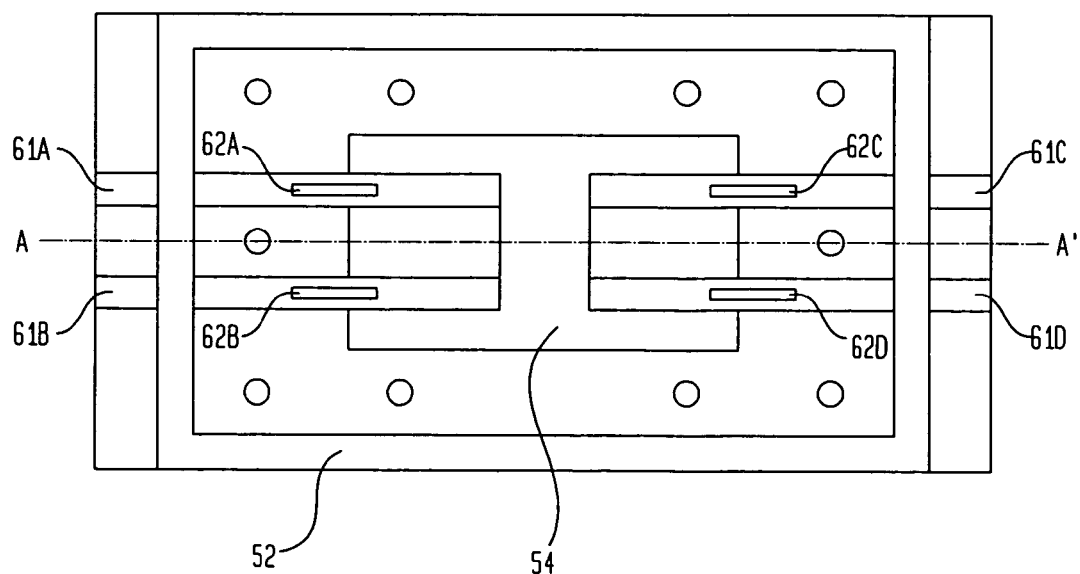

FIG. 4B illustrates a top view of gas damped STW resonator packaging system 50, with the lid 51 removed, showing upper sidewall 52, feed through leads 61A-D and wire bonds 62A-D. This configuration is appropriate for a STW device wherein the STW propagates on the upper surface 56 of the piezoelectric STW resonator 54, in which the resonator 54 is not affected by contacting the damping gas 20. The gas damped resonator packaging device 50 may also be equipped with suitable electrodes on the piezoelectric device as well as such leads, interconnects, and feed-throughs as may be required by the user.

Many of the variations that apply to the basic gas damped packaging device also apply to the gas damped STW resonator packaging apparatus 50, including the types of damping gas 20 pumped into the container 11, use of different damping material, the different types of fastening means 16 that may be used and so on. This embodiment may also be considered for pure-mode BAW resonators such as the AT-cut quartz piezoelectric resonator.

Figure 5A:
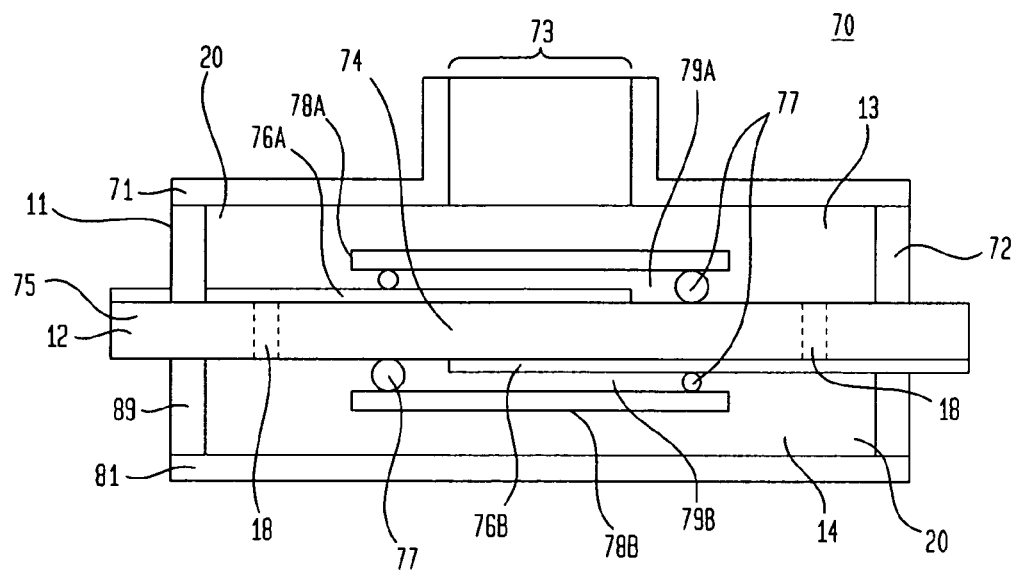
FIGS. 5A and 5B depict cut-away cross sectional and top views of the Bulk Acoustic Waves (BAW) embodiment of this invention's gas damped resonator packaging system.

Another preferred embodiment of the present invention is a gas damped Bulk Acoustic Wave (BAW) packaging system in which the active region of the piezoelectric resonator contacts evacuated regions that are enclosed with suitable covers bonded to the piezoelectric substrate. Referring now to FIG. 5A, there is depicted a cutaway cross-sectional view of the gas damped BAW resonator packaging system 70, comprising a container 11, a membrane 12 separating the container 11 into an first chamber 13 and a second chamber 14. The first chamber 13 further comprises a lid 71, upper sidewalls 72 and a valve means 73, such as a pinch-off valve, forming an integral part of the lid 71. A BAW piezoelectric resonator 74 is provided as an integral part of membrane 12, the BAW piezoelectric resonator 74 further comprising a piezoelectric substrate 75 and upper and lower electrode metallization regions 76A and 76B. An adhesive 77 binding an upper cover 78A and lower cover 78B to the piezoelectric substrate 75 and upper and lower electrode metallization regions 76A and 76B, as the case may be, defines an upper evacuated region 79A and a lower evacuated region 79B. Membrane 12 includes one or more orifices 18 that allow damping gas 20 to be exchanged between the first, or upper, chamber 13 and the second, or lower, chamber 14. The lower chamber 14 further comprises a lower sidewall 80 and lower lid 81. Both chambers 13 and 14 are filled with a damping gas 20. The cooperation of the membrane 12, the upper chamber 13 and the lower chamber 14 results in increased resistance in the lower chamber 14 to the movement of the membrane 12 which stabilizes BAW piezoelectric resonator 74.

Figure 5B:
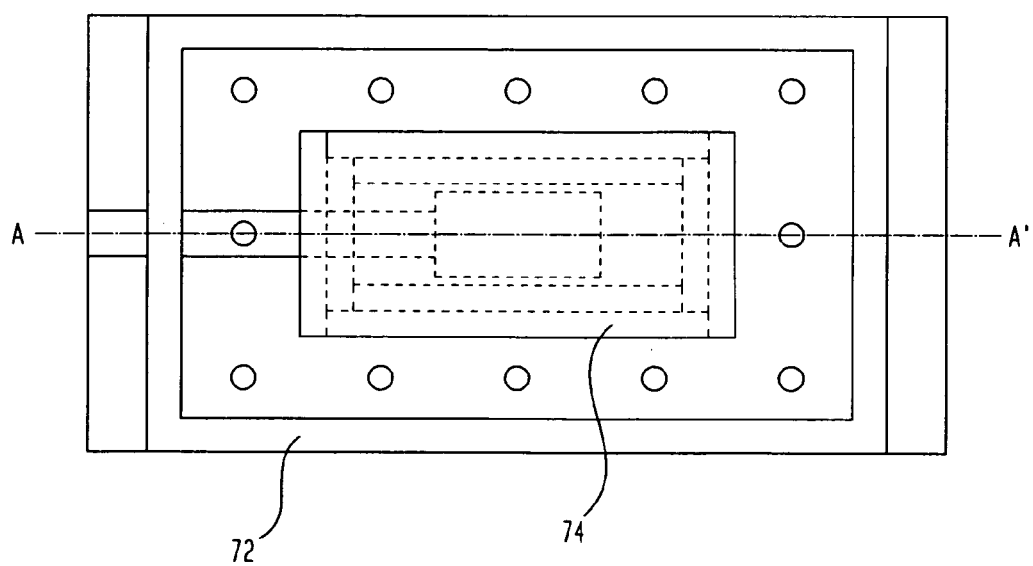

FIG. 5B illustrates a top view of gas damped BAW resonator packaging system 70, with the lid 71 removed, and shows that no wire bonds are necessary for this embodiment. Feed through leads are not required either as they are formed as part of the piezoelectric electrode metallization regions 76A and 76B.

The gas damped BAW resonator packaging system 70 may be considered appropriate for pure-mode, thickness-shear bulk acoustic wave (BAW) resonators such as AT-cut quartz resonators. In yet another embodiment, suitable for arbitrary BAW resonators such as SC-cut quartz resonators, the active region of piezoelectric substrate 75 can contact the evacuated regions 79A and 79B. Many of the variations that apply to the basic gas damped packaging device, the gas damped STW resonator packaging apparatus 50 and other embodiments also apply to the gas damped BAW resonator packaging system 70.

It is to be understood that such other features and modifications to the foregoing detailed description are within the contemplation of the invention, which is not limited by this description. As will be further appreciated by those skilled in the art, any number of variations and configurations, as well any number of combinations of circuits, differing materials and dimensions can achieve the results described herein. Accordingly, the present invention should not be limited by the foregoing description, but only by the appended claims.

What I claim is:

1. A fluid-damped acoustic wave resonator packaging system, comprising:
   a piezoelectric resonator is fastened to a membrane, said piezoelectric resonator further comprising a piezoelectric substrate and an electrode metallization region on at least one surface;
   said membrane being positioned in a container, said membrane divides said container into a first chamber and a second chamber;
   said first chamber having a lid with a valve means, said valve means evacuates said chamber and introduces a fluid into said container at a predetermined pressure level;
   said membrane having a plurality of flow-through orifices allowing said fluid to circulate freely between said chambers;
   said first chamber having a first given pressure level and a first given volume;
   said second chamber having a second given pressure level and a second given volume;
   said resonator propagating an acoustic wave;
   an unwanted external stress impinges on said system flexing said membrane, causing said fluid to circulate between said chambers, said first given volume being increased and said second given volume being decreased; and
   said given first pressure level being decreased and generating an increased second chamber pressure level to damp said external stress, stabilize said membrane and provide said resonator with a reduced susceptibility to said external stress, an increased frequency stability and an enhanced pressure stability.

2. The fluid-damped acoustic wave resonator packaging system, as recited in claim 1, further comprising said valve means being an integral part of said lid.

3. The fluid-damped acoustic wave resonator packaging system, as recited in claim 2, further comprising:
   said first chamber being an upper chamber;
   said second chamber being a lower chamber;
   said upper chamber having said lid, a plurality of upper sidewalls and said valve means, said valve means being a pinch-off valve; and
   said lower chamber having a plurality of lower sidewalls and a lower lid.

4. The fluid-damped acoustic wave resonator packaging system, as recited in claim 3, further comprising:
   said acoustic wave being a Surface Acoustic Waves (SAW); and
   said SAW being propagated on a lower surface of said piezoelectric resonator in an evacuated region under said piezoelectric resonator.

5. The fluid-damped acoustic wave resonator packaging system, as recited in claim 3, further comprising:
   said piezoelectric resonator being bonded to said membrane by an adhesive layer;
   said acoustic wave being a Surface Transverse Waves (STW); and
   said STW being propagated on an upper surface of said piezoelectric resonator.

6. The fluid-damped acoustic wave resonator packaging system, as recited in claim 3, further comprising:
   said piezoelectric resonator being an integral part of said membrane;
   a plurality of covers placed over said piezoelectric resonator define a plurality of evacuated regions;

said acoustic wave being a Bulk Acoustic Wave (BAW); and said BAW being propagated within one of said plurality of evacuated regions.

7. The fluid-damped acoustic wave resonator packaging system, as recited in claim 1, further comprising said fluid being nitrogen gas.

8. The fluid-damped acoustic wave resonator packaging system, as recited in claim 1, further comprising said fluid being a viscous liquid.

9. A fluid-damped acoustic wave resonator packaging apparatus, comprising:

a piezoelectric resonator is fastened to a membrane, said piezoelectric resonator further comprising a piezoelectric substrate and an electrode metallization region on an upper surface;

said membrane being positioned in a container, said membrane divides said container into a first chamber and a second chamber;

said piezoelectric resonator being bonded to said membrane by an adhesive layer;

said first chamber having a lid with a valve means, said valve means evacuates said chamber and introduces a fluid into said container at a predetermined pressure level;

said membrane having a plurality of flow-through orifices allowing said fluid to circulate freely between said chambers;

said first chamber having a first given pressure level and a first given volume;

said second chamber having a second given pressure level and a second given volume;

said resonator propagating an acoustic wave;

an unwanted external stress impinges on said system flexing said membrane, causing said fluid to circulate between said chambers, said first given volume being increased and said second given volume being decreased; and said given first pressure level being decreased and generating an increased second chamber pressure level to damp said external stress, stabilize said membrane and provide said resonator with a reduced susceptibility to said external stress, an increased frequency stability and an enhanced pressure stability.

10. The fluid-damped acoustic wave resonator packaging apparatus, as recited in claim 9, further comprising:

said first chamber being an upper chamber;

said second chamber being a lower chamber;

said upper chamber having said lid, a plurality of upper sidewalls and said valve means, said valve means being a pinch-off valve; and said lower chamber having a plurality of lower sidewalls and a lower lid.

11. The fluid-damped acoustic wave resonator packaging apparatus, as recited in claim 10, further comprising:

said acoustic wave being a Surface Transverse Waves (STW); and said STW being propagated on an upper surface of said piezoelectric resonator.

12. The fluid-damped acoustic wave resonator packaging apparatus, as recited in claim 10, further comprising:

said piezoelectric resonator being an AT-cut quartz piezoelectric resonator;

said acoustic wave being a Bulk Acoustic Wave (BAW); and said BAW being propagated on said upper surface.

13. The fluid-damped acoustic wave resonator packaging apparatus, as recited in claim 9, further comprising said fluid being nitrogen gas.

14. The fluid-damped acoustic wave resonator packaging apparatus, as recited in claim 9, wherein said fluid is a viscous liquid.

15. A fluid-damped BAW resonator packaging system, comprising:

a BAW piezoelectric resonator is located on a membrane, said BAW piezoelectric resonator further comprising a piezoelectric substrate, an upper active region, a plurality of upper electrode metallization sections, an upper cover, a lower active region, a plurality of lower electrode metallization sections and a lower cover;

said membrane being positioned in a container, said membrane divides said container into a first chamber and a second chamber;

said first chamber having a lid with a valve means, said valve means evacuates said chamber and introduces a fluid into said container at a predetermined pressure level;

said membrane having a plurality of flow-through orifices allowing said fluid to circulate freely between said chambers;

said plurality of upper electrode metallization sections and said upper cover define an upper evacuated region contacting said active upper region;

said plurality of lower electrode metallization sections and said lower cover define a lower evacuated region contacting said active lower region;

said first chamber having a first given pressure level and a first given volume;

said second chamber having a second given pressure level and a second given volume;

said BAW piezoelectric resonator propagates a plurality of BAW acoustic waves in said upper active region and said lower active region;

an unwanted external stress impinges on said system flexing said membrane, causing said fluid to circulate between said chambers, said first given volume being increased and said second given volume being decreased; and said given first pressure level being decreased and generating an increased second chamber pressure level to damp said external stress, stabilize said membrane and provide said resonator with a reduced susceptibility to said external stress, an increased frequency stability and an enhanced pressure stability.

16. The fluid-damped BAW resonator packaging system, as recited in claim 15, further comprising said BAW piezoelectric resonator is provided as an integral part of said membrane.

17. The fluid-damped BAW resonator packaging system, as recited in claim 16, further comprising:

said first chamber being an upper chamber;

said second chamber being a lower chamber;

said upper chamber having said lid, a plurality of upper sidewalls and said valve means, said valve means being a pinch-off valve; and said lower chamber having a plurality of lower sidewalls and a lower lid.

18. The fluid-damped BAW resonator packaging system, as recited in claim 17, further comprising said fluid being a suitable gas.

19. The fluid-damped BAW resonator packaging system, as recited in claim 18, wherein said suitable gas is nitrogen.

* * * * *